United States Patent [19]

Mansuria et al.

[11] Patent Number: 5,032,897
[45] Date of Patent: Jul. 16, 1991

[54] INTEGRATED THERMOELECTRIC COOLING

[75] Inventors: Mohanlal S. Mansuria, Coral Springs; Joseph M. Mosley; Richard D. Musa, both of Boca Raton, all of Fla.; William F. Shutler, Wappingers Falls, N.Y.; Vito J. Tuozzolo, Boca Raton, Fla.

[73] Assignee: International Business Machines Corp., Armonk, N.Y.

[21] Appl. No.: 486,467

[22] Filed: Feb. 28, 1990

[51] Int. Cl.$^5$ .............................................. H01L 23/38
[52] U.S. Cl. ........................................ 357/81; 357/74; 357/80; 357/68; 357/87
[58] Field of Search ...................... 357/71, 72, 28, 82, 357/73, 81, 80, 74, 87, 68; 361/381, 388, 389

[56] References Cited

U.S. PATENT DOCUMENTS

| Re. 27,934 | 3/1974 | Merrin et al. | 357/65 |
| 3,429,040 | 2/1969 | Miller | 29/840 |
| 3,994,277 | 11/1976 | Altman | 126/270 |
| 4,011,104 | 3/1977 | Basiulis | 136/205 |
| 4,034,469 | 7/1977 | Koopman et al. | 29/628 |
| 4,147,040 | 4/1979 | Altman | 62/467 R |
| 4,150,552 | 4/1979 | Altman | 62/467 R |
| 4,155,226 | 5/1979 | Altman | 62/467 R |
| 4,238,759 | 12/1980 | Hunsperger | 357/28 |
| 4,279,292 | 7/1981 | Swichosz | 165/61 |
| 4,297,653 | 10/1981 | Scifres et al. | 331/94.55 |
| 4,338,577 | 7/1982 | Sato et al. | 372/36 |
| 4,399,541 | 8/1983 | Kovats et al. | 372/36 |
| 4,604,753 | 8/1986 | Sawai | 372/36 |
| 4,621,279 | 11/1986 | Maier et al. | 357/83 |
| 4,730,459 | 3/1988 | Schlicklin et al. | 136/204 |
| 4,855,810 | 8/1989 | Gelb et al. | 357/71 |
| 4,926,227 | 5/1990 | Jensen | 357/72 |

FOREIGN PATENT DOCUMENTS

| 2542174 | 7/1976 | Fed. Rep. of Germany . |
| 2634274 | 2/1978 | Fed. Rep. of Germany . |
| 63-175202 | 7/1988 | Japan . |
| 2054949 | 2/1981 | United Kingdom . |
| 2097184 | 10/1982 | United Kingdom . |
| 2112565 | 7/1983 | United Kingdom . |

Primary Examiner—William D. Larkins
Assistant Examiner—Daniel N. Russell
Attorney, Agent, or Firm—Stephen A. Terrile

[57] ABSTRACT

A thermoelectrically cooled integrated circuit package including an insulative module which defines a cavity, a thermoelectric cooler within the cavity, and an integrated circuit chip connected to the thermoelectric cooler, thus providing an integrated circuit package in which the integrated circuit package itself dissipates thermal energy generated by the integrated circuit chip.

16 Claims, 2 Drawing Sheets

INTEGRATED THERMOELECTRIC COOLING

BACKGROUND OF THE INVENTION

The present invention relates to thermoelectric coolers (TEC's).

It is known to use a thermoelectric cooler to lower the operating temperature of a semiconductor device such as a laser. A thermoelectric cooler includes a plurality of thermoelectric cooling elements, which are constructed of materials with dissimilar characteristics. The elements are connected electrically in series and thermally in parallel to provide a plurality of thermoelectric couples. Each thermoelectric couple includes one element having a first characteristic and another element having a second characteristic. The thermoelectric couples are connected between two plates which function as a hot side and a cold side of a thermoelectric cooler. The hot side is thermally connected to a heat sink and the cold side is thermally connected to the semiconductor device.

Thermoelectric cooling is achieved by passing electric current through the thermoelectric cooler. Thermal energy is drawn from the cold side to the hot side at a rate which is proportional to carrier current passing through the circuit and the number of couples. At the hot side, the thermal energy is dissipated by the heat sink. The thermoelectric cooling effect is greatly increased when the dissimilar conducting materials used are semiconducting materials.

The dissimilar semiconducting materials generally used for thermoelectric cooling are N-type material (more electrons than necessary to complete a perfect molecular lattice structure) and P-type material (fewer electrons than necessary to complete a perfect molecular lattice structure, thus providing holes). The extra electrons in the N-type material and the holes in the P-type material are called "carriers" which function to move the thermal energy from the cold side to the hot side.

SUMMARY OF THE INVENTION

It has been discovered that providing an integrated circuit package with a module defining a cavity and providing a thermoelectric cooler which thermally connects an integrated circuit chip to a wall of the module cavity advantageously provides a thermoelectrically cooled integrated circuit package in which the integrated circuit package module dissipates heat. Additionally, because the chip is positioned within the integrated circuit package module, thermal shunting and the formation of condensation are reduced.

In preferred embodiments, thermoelectric cooler elements of the thermoelectric cooler may be connected directly to the wall of the module cavity, the integrated circuit chip may be electrically connected to input/output pins via wire bonds or controlled chip collapse connections, the thermoelectric cooler may be hermetically sealed within the module cavity, and a heat sink may be bonded to the exterior of the integrated circuit package.

DETAILED DESCRIPTION

Figure 1:
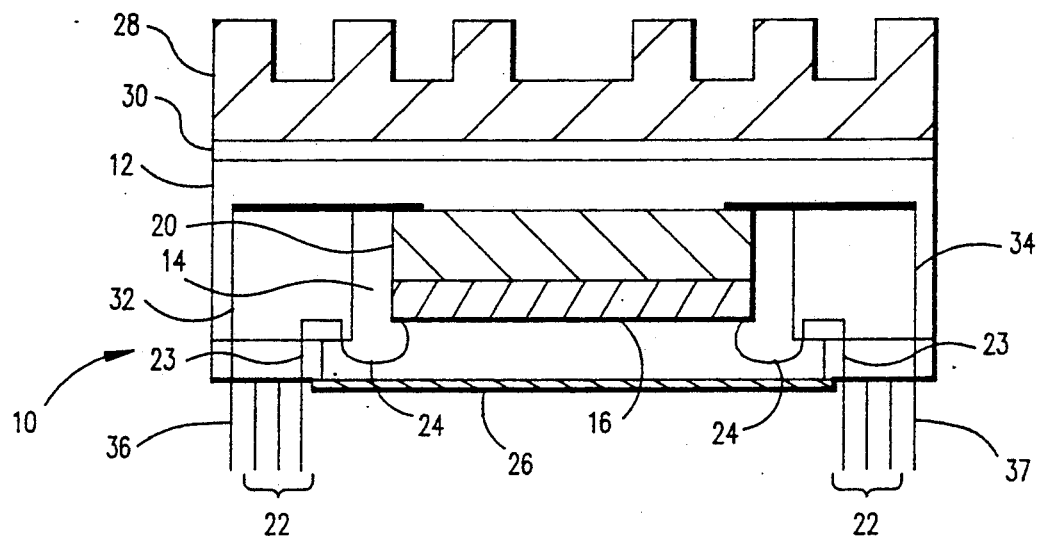
FIG. 1 shows a diagrammatic cross-sectional view of an integrated circuit package which includes an internally mounted thermoelectric cooler according to the present invention.

Referring to FIG. 1, integrated circuit package 10, which is a first level of integration, includes multilayer ceramic, electrically insulative, thermally conductive chip carrier module 12 (e.g., a Kyocera multilayer ceramic (MLC) carrier) which defines cavity 14. Integrated circuit chip 16 is located within cavity 14 and is thermally and physically connected to module 12 via thermoelectric cooler 20. Input/output pins 22 are electrically connected to integrated circuit chip 16 via conductors 23 which are passed through channels defined by module 12; conductors 23 are connected to integrated circuit chip 16 via wires 24 which are bonded to integrated circuit chip 16 using conventional wire bond technology. Metal protective cover 26 is positioned over cavity 14 and attached to module 12 with adhesive to provide a hermetically sealed package. Additionally, heat sink 28 is attached to the exterior of module 12 with thermally conductive layer 30.

Power is supplied directly to thermoelectric cooler 20 via conductors 32, 34 and pins 36, 37. Conductors 32, 34 are passed through channels which are defined by module 12. Conductors 32, 34 electrically connect thermoelectric cooler 20 to pins 36, 37, respectively, thus eliminating the need for wire bonds or flying leads from the input/output (I/0) pins to the thermoelectric cooler.

Figure 2:
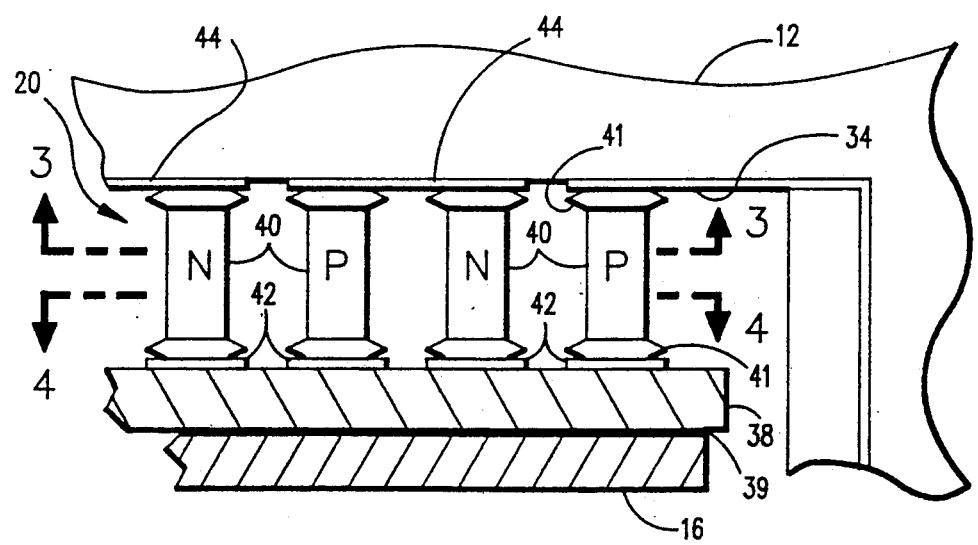
FIG. 2 shows a diagrammatic enlarged cross-sectional view of a portion of the thermoelectric cooler of the FIG. 1 integrated circuit package.
Figure 3:
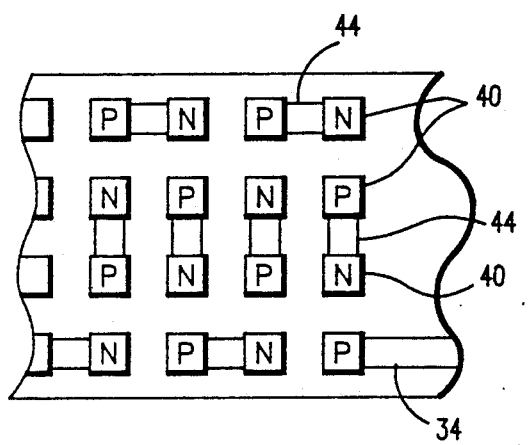
FIG. 3 shows a portion of the FIG. 2 integrated circuit package along the line 3—3.
Figure 4:
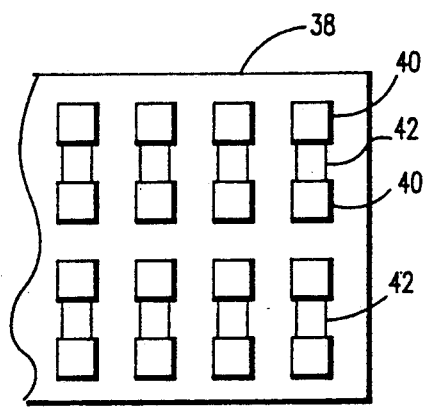
FIG. 4 shows a portion of the cold plate for the FIG. 2 integrated circuit package along the line 4—4.

Referring to FIGS. 2—4, thermoelectric cooler 20 includes a plurality of thermoelectric cooler elements 40 which are connected between thermally conductive cold plate 38 and multilayer ceramic module 12. Integrated circuit chip 16 is physically connected to cold plate 38 via thermally conductive material 39 (e.g., thermal epoxy or gold eutectic).

Each cooler element 40 is constructed of either P-type semiconductor material or N-type semiconductor material. The P and N type elements are connected alternately, electrically in series and thermally in parallel.

More specifically, the P and N type elements are connected electrically in series via solder joints 41 to conductors 42 and 44. Conductors 42 are metalized circuit patterns which are applied to the surface of cold plate 38 as shown in FIG. 4 and conductors 44 are metalized circuit patterns which are applied to the surface of the cavity wall of module 12 as shown in FIG. 3. Thus, the inside of the cavity wall functions as the hot side of the thermoelectric cooler, thereby eliminating one of the plates required for a thermoelectric cooler. Because there is no hot plate, there is a more direct cooling path as there is less thermal resistance; additionally, constructing the thermoelectric cooler in this manner requires fewer parts. Also, because the thermoelectric cooler draws thermal energy from the integrated circuit chip to the module, passive heat loads on the thermoelectric cooler from surrounding air or cards are eliminated as the module is hotter than the surrounding air or cards.

In operation, power is applied to thermoelectric cooler 20 via pins 36, 37, thus causing thermoelectric cooler 20 to draw thermal energy away from integrated circuit chip 16 via cold plate 38. The thermal energy is drawn towards the cavity wall of module 12 on which conductors 44 are located. Thermal energy is then dissipated via module 12 and heat sink 28.

More specifically, cooling occurs at each couple because electrons pass from a low energy level in the p-type element through conductor 42 to a higher energy level in the n-type element. The energy required to achieve the higher energy level is derived from thermal energy which is absorbed via conductors 42. This energy is dissipated via conductors 44 which are connected directly to a cavity wall of module 12. Accordingly, because elements 40 of thermoelectric cooler 20 are connected directly between integrated circuit chip 16 and module 12, only the chip is cooled while the remainder of package 10 functions as a heat sink.

OTHER EMBODIMENTS

Other embodiments are within the following claims.

For example, the integrated circuit package may include integrated circuit chips which are connected to input/output pins 22 using a different type of connection technology (e.g., controlled chip collapse connection technology (C-4 connection technology)).

Figure 5:
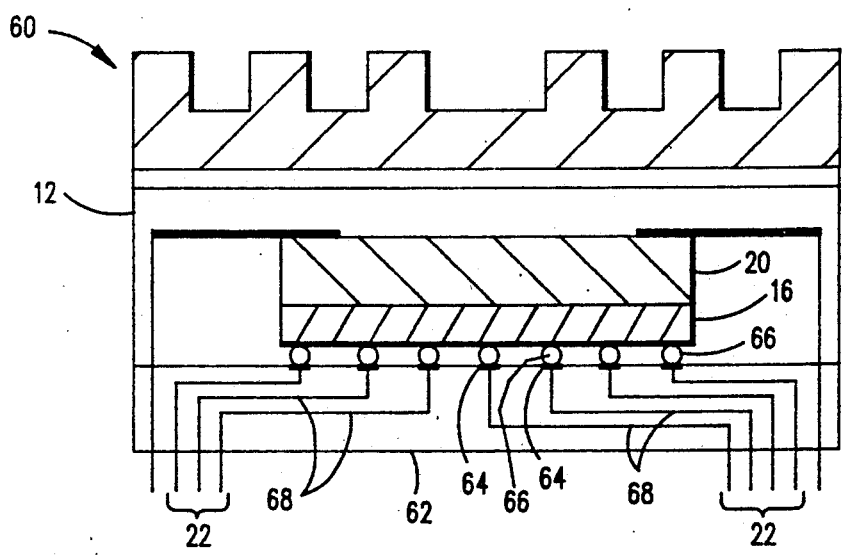
FIG. 5 shows a diagrammatic cross-sectional view of an alternate integrated circuit package which includes an internally mounted thermoelectric cooler according to the present invention.

More specifically, referring to FIG. 5, an integrated circuit package 60 which uses C-4 connection technology is shown. Descriptions of the C-4 connection technology are set forth in Miller U.S. Pat. No. 3,429,040, and Merrin et al., Re. 27,934, which are hereby incorporated by reference.

In general, C-4 connection technology utilizes surface tension of a connecting material such as solder to support integrated circuit chip 16 on dielectric supporting substrate 62 as well as to electrically connect chip 16 to conductive portions 64 which are located on substrate 62.

More specifically, dielectric supporting substrate 62 is provided with a plurality of connecting portions 64 which are wettable with solder. The areas immediately surrounding connecting portions 64 are not wettable with solder. A coating of solder is then applied to the size-limited connecting portions. Integrated circuit chip 16 which has solder contacts extending therefrom is then positioned on the preselected soldered connecting portions. The solder contacts are placed with flux onto the solder to hold the chip temporarily in place. Substrate 62 and chip 16 are then heated to a temperature at which the solder melts. The molten solder is maintained in substantially a ball shape because the areas immediately adjacent to the connecting portions are not wettable with solder. The solder connection is then allowed to cool to provide solder balls 66; chip 16 is thus electrically connected to the connecting portions 64 on dielectric substrate 62 via solder balls 66. Connecting portions 64 are electrically connected to input/output pins 22 via conductors 68 which pass through channels defined by substrate 62. Thermal grease or soft metal is placed between chip 16 and TEC 20 to facilitate heat transfer from chip 16 to TEC 20.

Also, for example, the integrated circuit package may include a plurality of thermoelectrically cooled integrated circuit chips. These chips may be cooled by a single thermoelectric cooler or by a plurality of thermoelectric coolers. Each of the plurality of thermoelectric coolers may correspond to a plurality of integrated circuit chips or to a respective integrated circuit chip. When a plurality of thermoelectric coolers are used, the module cavity wall carries metalized circuit patterns for each of the thermoelectric coolers.

What is claimed is:

1. An integrated circuit package comprising
   an electrically insulative module,
      said module including a plurality of walls including a bottom surface,
      said plurality of walls defining a cavity,
      said module including a plurality of input/output pins,
      said module defining integrated circuit connection conductors which extend from some of said input/output pins to positions located along the walls of said cavity spaced from the bottom surface of said cavity,
      said module defining thermoelectric cooler conductor channels which extend from others of said input/output pins to said bottom surface of said cavity,
   an integrated circuit chip positioned within said cavity,
      said integrated circuit chip being electrically connected to said portions located along the walls of said cavity,
   a thermoelectric cooler having a first side and a second side,
      said first side of said thermoelectric cooler being thermally connected to said integrated circuit chip, and
      said second side being thermally connected to said bottom surface of said cavity so as to cool said integrated circuit chip, and
   thermoelectric cooler conductors passing though said thermoelectric conductor channels,
      said thermoelectric cooler conductors being electrically connected between said second side of said thermoelectric cooler and said others of said input/output pins.

2. The integrated circuit package of claim 1 wherein
   said thermoelectric cooler includes a plurality of thermoelectric cooler elements,
      each said thermoelectric cooler element having a first end oriented in the direction of said module and a second end oriented in the direction of said integrated circuit chip.

3. The integrated circuit package of claim 2 wherein said module includes first conductors positioned along a wall of said cavity,
   said first conductors electrically connecting pairs of said first ends of said thermoelectric cooler elements so as to provide a hot side of said thermoelectric cooler.

4. The integrated circuit package of claim 3 further comprising
   a cold plate positioned between said integrated circuit chip and said thermoelectric cooler, said cold plate being configured to conduct thermal energy from said integrated circuit chip to said thermoelectric cooler,
      said cold plate including second conductors, said second conductors electrically connecting pairs of said second ends so as to provide a cold side of said thermoelectric cooler.

5. The integrated circuit package of claim 2 wherein said thermoelectric cooler elements are constructed of semiconductor materials.

6. The integrated circuit package of claim 5 wherein said thermoelectric cooler elements are constructed of different types of said semiconductor materials.

7. The integrated circuit package of claim 6 wherein said different types of semiconductor materials include P-type material and N-type material.

8. The integrated circuit package of claim 7 wherein said P-type material and N-type material are arranged alternately, electrically in series and thermally in parallel.

9. The integrated circuit package of claim 1 further comprising:
a heat sink attached to an exterior wall of said module.

10. The integrated circuit package of claim 1 wherein said input/output pins are electrically connected to said integrated circuit chip via wire bond connections.

11. The integrated circuit package of claim 1 wherein said input/output pins are electrically connected to said integrated circuit chip via controlled chip collapse connections.

12. The integrated circuit package of claim 1 wherein said thermoelectric cooler is hermetically sealed within said module.

13. The integrated circuit package of claim 1 wherein portions of said thermoelectric cooler conductors are located along walls of said module cavity.

14. The integrated circuit package of claim 1 further comprising
a plurality of integrated circuit chips thermally connected to said thermoelectric cooler.

15. The integrated circuit package of claim 1 further comprising
a plurality of integrated circuit chips, and
a plurality of thermoelectric coolers, said thermoelectric coolers being thermally connected between said integrated circuit chips and a wall of said cavity so as to cool said integrated circuit chips.

16. The integrated circuit package of claim 15 wherein
said plurality of thermoelectric coolers correspond to respective integrated circuit chips.

* * * * *